United States Patent
Stocken et al.

(10) Patent No.: US 7,251,772 B2
(45) Date of Patent: Jul. 31, 2007

(54) CIRCUIT ARRANGEMENT HAVING A NUMBER OF INTEGRATED CIRCUIT COMPONENTS ON A CARRIER SUBSTRATE AND METHOD FOR TESTING A CIRCUIT ARRANGEMENT OF THIS TYPE

(75) Inventors: Christian Stocken, München (DE); Gerald Resch, München (DE); Manfred Pröll, Dorfen (DE); Manfred Dobler, München (DE)

(73) Assignee: Infineon Technologies, AG, Neubiberg (DE)

( * ) Notice: Subject to any disclaimer, the term of this patent is extended or adjusted under 35 U.S.C. 154(b) by 567 days.

(21) Appl. No.: 10/732,402

(22) Filed: Dec. 11, 2003

(65) Prior Publication Data
US 2004/0136249 A1    Jul. 15, 2004

(30) Foreign Application Priority Data
Dec. 12, 2002   (DE) ............................... 102 58 199

(51) Int. Cl.
*G06F 11/08* (2006.01)
*G06F 13/14* (2006.01)

(52) U.S. Cl. ...................... 714/798; 710/305

(58) Field of Classification Search ............... 714/724, 714/798; 324/73.1; 365/201; 710/305–306
See application file for complete search history.

(56) References Cited

U.S. PATENT DOCUMENTS

| | | | |
|---|---|---|---|
| 5,796,746 A | 8/1998 | Farnworth et al. | |
| 5,956,280 A | 9/1999 | Lawrence | |
| 6,492,923 B1 * | 12/2002 | Inoue et al. | 341/120 |
| 6,618,304 B2 * | 9/2003 | Duesman | 365/201 |
| 6,697,291 B2 * | 2/2004 | Frankowsky | 365/201 |
| 6,968,485 B2 * | 11/2005 | Van Kirk | 714/724 |

\* cited by examiner

*Primary Examiner*—Cynthia Britt
(74) *Attorney, Agent, or Firm*—Edell, Shapiro & Finnan, LLC

(57) ABSTRACT

A circuit arrangement can have a number of integrated circuit components, which are arranged on a carrier substrate. A reception circuit for receiving a control signal can be coupled to one of the connection pads on the input side and can be connected to each of the circuit components on the output side. A bridging circuit controlled by a test mode signal can electrically bridge the reception circuit. In a testing method, a plurality of connection pads can be connected to a first potential and at least one of the connection pads can be connected to a second potential. The bridging circuit can be activated and the current measured, by a test arrangement, at the at least one of the connection pads. Inspection for leakage currents in connections between input-side reception circuits and the circuit components can be measured.

10 Claims, 1 Drawing Sheet

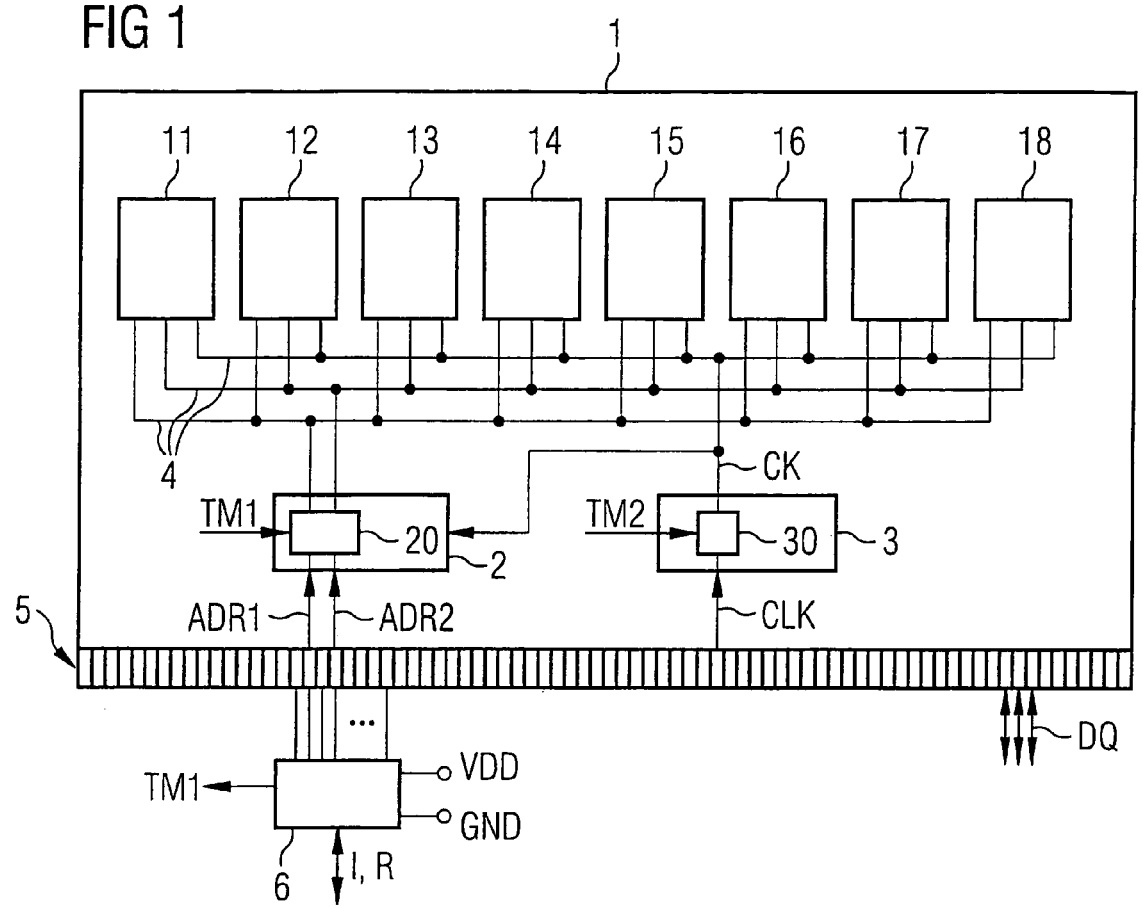
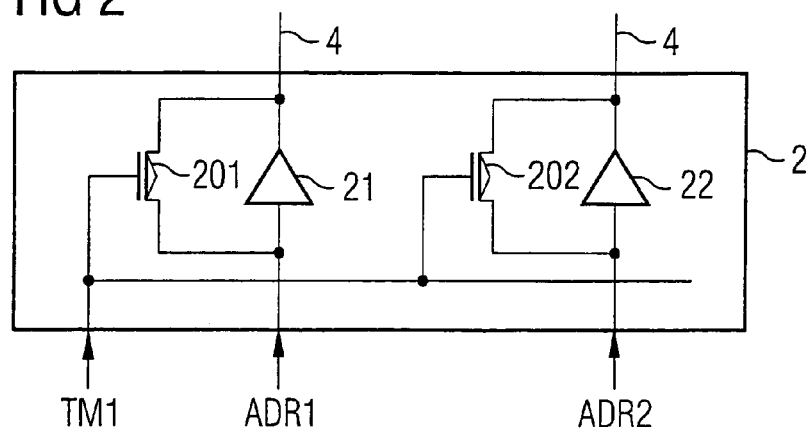

CIRCUIT ARRANGEMENT HAVING A NUMBER OF INTEGRATED CIRCUIT COMPONENTS ON A CARRIER SUBSTRATE AND METHOD FOR TESTING A CIRCUIT ARRANGEMENT OF THIS TYPE

CROSS-REFERENCE TO RELATED APPLICATION

This application claims priority from German Patent Application No. 10258199.1, entitled "Circuit Arrangement Having A Number Of Integrated Circuit Components on a Carrier Substrate And Method For Testing a Circuit Arrangement of This Type," and filed on Dec. 12, 2002, the disclosure of which is incorporated herein by reference in its entirety.

FIELD OF THE INVENTION

The present invention relates to a circuit arrangement having a number of integrated circuit components, which are arranged on a carrier substrate having connection pads for interchanging control signals and data signals, and to a method for testing a circuit arrangement of this type.

BACKGROUND

In computer systems, for example, it is known to arrange a number of circuit components, for instance, memory components such as DRAMs (Dynamic Random Access Memories), on a common carrier substrate. Memory arrangements of this type are known, in particular, as "DIMMs" (Registered or Buffered Dual Inline Memory Module). The latter are typically fitted with 16 or 18 memory chips, which are clock-controlled when "SDRAMs" or "DDR DRAMs."

In addition to memory components, a typical Dual Inline Memory Module (DIMM) includes, in particular, register circuits, buffer circuits, and synchronization circuits, such as "PLL" circuits. Circuits of this type are jointly associated with all the memory components on the module and are used, in particular, to amplify address signals, command signals, and clock signals, respectively, which are fed into the module, for example, by an external controller, for the purpose of controlling operation of the memory components. Register circuits and buffer circuits are used, in particular, to receive and amplify address signals or command signals. A (Phase Locked Loop PLL) circuit receives a clock signal (externally fed in) and generates, at its output, a corresponding phase-shifted clock signal, which serves to control clock-controlled memory components in the DIMM.

In the process of fabricating module arrangements of this type, it is customary to subject them to a quality control test during or after the fabrication process. In addition to checking the module's general functionality, an inspection to ascertain whether leakage currents or short circuit currents occur on individual connecting lines or connection pins, caused, for example, by short circuits between lines or between two connection pins is also conducted. However, for the register circuits, buffer circuits or PLL circuits connected upstream of the memory components, the inspection of the connecting lines and connection pins carrying control signals is limited. The reception circuits for receiving the respective control signals are used, in particular, to decouple the connecting lines between the respective reception circuit and the memory components on the module and the input lines of the reception circuits having the respective connection pins from one another. It has thus not been possible to satisfactorily inspect the electrical connections between the reception circuits and the memory components (carrying the abovementioned control signals) for leakage currents and short circuit currents.

Against this background, attempts have been made to conduct leakage tests for the purpose of detecting leakage currents in electrical connections or connection pins of this type with the aid of function tests, which test the functionality of the individual memory components. However, individual leakage currents and short circuits in electrical connections of this type can be measured only indirectly thereby and it is also possible to detect only those leakage currents and short circuits, respectively, which impair the functionality of the module and memory components, respectively. It has not been possible to detect leakage currents, which do not impair functionality but constitute a reliability problem (for example, degradation over time).

SUMMARY

A circuit arrangement in which it is possible to inspect a module arrangement includes a plurality of circuit components on a carrier substrate for leakage currents and short circuits in electrical connections between an input-side reception circuit and the circuit components. A method for testing such a circuit arrangement is desirable.

Generally, a circuit arrangement can include a number of integrated circuit components which are arranged on a carrier substrate having connection pads for interchanging control signals and data signals. Additionally, at least one reception circuit for receiving one of the control signals can be included. The reception circuit can be coupled to one of the connection pads on the input side and connected to each of the circuit components on the output side. A bridging circuit, which is controlled by a test mode signal and which is used to electrically bridge the reception circuit as a function of the state of the test mode signal, can also be included.

With this circuit arrangement, inspection of a module arrangement includes a plurality of circuit components on a carrier substrate for leakage currents in electrical connections between an input-side reception circuit and the circuit components can occur. The test mode signal can be used to set a test mode in which the reception circuit is bridged and the inputs and outputs of the latter are thus shorted together. The electrical decoupling between the inputs of a reception circuit and the electrical connections between the reception circuit and the circuit components (that is to say the decoupling from the connection pads on the carrier substrate up to the circuit components) can be lifted. The leakage currents and short circuit currents in the electrical connections (carrying the control signals) between the reception circuit and the circuit components can thus be ascertained by measurement in the fabrication process using a corresponding quality inspection test before the respective module is delivered to the customer.

A method for testing such a circuit arrangement can include a number of connection pads for interchanging control signals connected to a first potential and at least one connection pad for interchanging control signals connected to a second potential, which is different than the first. A bridging circuit can be activated by the test mode signal and the current can be measured, by a test arrangement, at the at least one of the connection pads connected to the second potential. Current measurement of this type can be used, in particular, to determine high and/or low resistances between selected connection pads for interchanging control signals and electrical lines, which can be arranged between the reception circuit and the circuit components.

The circuit arrangement may be used in a DIMM module arrangement in which the circuit components are integrated memory components. However, the circuit arrangement may be used for any desired module arrangement having a plurality of integrated circuit components arranged thereon, in which control signals for controlling operation of the circuit components are forwarded from connection pads on the module to the circuit components via reception circuits.

BRIEF DESCRIPTION OF THE DRAWINGS

The invention is explained in more detail below with reference to the FIG.s, which are illustrated in the drawing, represent exemplary embodiments of the present invention and in which FIG. 1 illustrates a circuit arrangement having a plurality of memory components on a carrier substrate; and FIG. 2 illustrates a detailed view of a buffer circuit of the circuit arrangement of FIG. 1.

Like reference numerals in the various drawings indicate like elements.

DETAILED DESCRIPTION

FIG. 1, a circuit arrangement can include a plurality of memory components which are arranged on a carrier substrate. In this case, FIG. 1 shows a typical component arrangement on a Dual Inline Memory Module (DIMM). Memory components in the form of DRAMs 11, 12, 13, 14, 15, 16, 17, 18 can be arranged on a carrier substrate 1. The carrier substrate 1 can have a connection panel having connection pads 5, which are used to interchange control signals, particularly address signals, command signals and clock signals, and to interchange data signals.

A buffer circuit 2 and a synchronization circuit in the form of a PLL circuit 3 can be connected between the memory components 11, 12, 13, 14, 15, 16, 17, 18 and the connection pads 5. Buffer circuit 2 can receive and amplify address signals ADR1, ADR2, which, at the output of the buffer circuit 2, can be forwarded to the memory components 11, 12, 13, 14, 15, 16, 17, 18 via the lines 4. The PLL circuit 3 can receive an external clock signal CLK on the input side and, at its output, can generate a corresponding phase-shifted internal clock signal CK, which is used to control the memory components 11, 12, 13, 14, 15, 16, 17, 18 in the DIMM. Both the buffer circuit 2 and the PLL circuit 3 can be coupled to respective connection pads 5 on the input side and are connected to each of the memory components 11, 12, 13, 14, 15, 16, 17, 18 on the output side. Data signals DQ can be transmitted between the module and an external controller, for example, via further connection pads 5.

The buffer circuit 2 and the PLL circuit 3 each can have a bridging circuit 20 or 30, respectively, which is controlled by a test mode signal TM1, TM2. The bridging circuits are illustrated only schematically in FIG. 1. The bridging circuit can be used to electrically bridge the buffer circuit 2 and PLL circuit 3, that is to say the respective inputs and outputs of the buffer circuit 2 and PLL circuit 3 can be shorted by the bridging circuits 20, 30, respectively. In this case, the bridging circuits 20, 30 can be activated by the test mode signals TM1, TM2.

Referring to FIG. 2, a detailed view of the buffer circuit of the circuit arrangement of FIG. 1 can include address signals ADR1 and ADR2 at its inputs. These address signals ADR1, ADR2 can be forwarded to the lines 4 via amplifier circuits 21, 22. The amplifier circuits 21, 22 can be used to electrically decouple the lines 4 from the inputs of the buffer circuit 2, which are connected to the connection pads 5. It is thus initially not possible to electrically access the lines 4 and solder points between the buffer circuit 2 and the memory components 11, 12, 13, 14, 15, 16, 17, 18 directly via the connection pads 5 in order to uncover possible problem points with regard to leakage currents and short circuit currents.

Accordingly, the amplifier circuits 21, 22 can be electrically bridged by the bridging circuits 201, 202 (in the form of short circuit transistors) in a corresponding test mode controlled by the test mode signal TM1. Electrically bridging the amplifier circuits 21, 22 can provide direct external access possible and thus can allow corresponding leakage current measurements possible for the previously electrically decoupled lines 4.

In order to carry out a leakage current test on a module arrangement as shown in FIG. 1, a test arrangement 6 in the form of an external test unit can be connected to the carrier substrate 1 at a number of connection pads 5. In this case, the test unit 6 can generate the voltages VDD (positive supply voltage) and GND (reference ground potential or ground). Alternatively, corresponding voltages can be applied to the test unit 6 externally. In a method for testing a module arrangement as shown in FIG. 1, the test unit 6 can connect a number of connection pads 5 (which can be used to interchange control signals ADR) to the potential GND and connects at least one of the connection pads to the potential VDD, which is different than the potential GND. The test unit 6 can generate the test mode signal TM1 and thus can activate the bridging circuit 20 or the bridging circuits 201 and 202, as shown in FIG. 2. The current is then measured at the connection pad, which is at the potential VDD. The measured current I can be used to determine high and/or low resistances R between selected connection pads 5 and the lines 4. The described measurement can then be repeated, with the corresponding connection pads, and can be compared to the previous measurement, being connected to the respective other potential VDD or GND.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
| --- | --- |
| 1 | Carrier substrate |
| 2 | Buffer circuit |
| 3 | PLL circuit |
| 4 | Lines |
| 5 | Connection pads |
| 6 | Test arrangement |
| 11 to 18 | Memory component |
| 20, 30 | Bridging circuit |
| 21, 22 | Amplifier circuit |
| 201, 202 | Bridging circuit |
| TM1, TM2 | Test mode signal |
| ADR1, ADR2 | Address signal |
| CLK | External clock signal |
| CK | Internal clock signal |
| VDD, GND | Voltage/potential |

-continued

| List of reference symbols | |
|---|---|
| I | Current |
| R | Resistance |
| DQ | Data signals |

What is claimed is:

1. A circuit arrangement, comprising:
a carrier substrate including connection pads to interchange control signals and data signals;
a plurality of integrated circuit components, the components being arranged on the carrier substrate;
at least one reception circuit to receive one of the control signals, the reception circuit being coupled to one of the connection pads on an input side and being connected to each of the circuit components on an output side; and
a bridging circuit, the bridging circuit being controlled by a test mode signal that electrically bridges the reception circuit such that the input side and the output side of the reception circuit are shorted together.

2. The circuit arrangement as claimed in claim 1, wherein the reception circuit is one of a register circuit, a buffer circuit, or a synchronization circuit.

3. The circuit arrangement as claimed in claim 1, wherein the reception circuit receives address signals command signals, or clock signals.

4. The circuit arrangement as claimed in claim 1, wherein the circuit arrangement is a module arrangement in a DIMM, and wherein the circuit components are memory components.

5. A method for testing a circuit arrangement, comprising:
receiving control signals on at least one reception circuit, the reception circuit being coupled to at least one connection pad on an input side of the reception circuit and being connected to each of a plurality of circuit components on an output side of the reception circuit; and
electrically bridging the reception circuit with a bridging circuit such that the input side and the output side of the reception circuit are shorted together, the bridging circuit being controlled by a test mode signal;
wherein the connection pads interchange the control signals, the connection pads being connected to a first potential, at least one of the connection pads being connected to a second potential,
wherein the bridging circuit is activated by the test mode signal, and
wherein a current is measured by a test arrangement at the at least one of the connection pads.

6. The method as claimed in claim 5, further comprising:
determining at least one resistance between connection pads and lines using the current measurement, the connection pads and lines being arranged between the reception circuit and the circuit components.

7. The method as claimed in claim 5, wherein the circuit arrangement includes a carrier substrate including connection pads to interchange control signals and data signals, a plurality of integrated circuit components, the circuit components being arranged on the carrier substrate, and at least one reception circuit to receive one of the control signals, the reception circuit being coupled to one of the connection pads on the input side and being connected to each of the circuit components on the output side.

8. The method as claimed in claim 5, wherein the reception circuit is one of a register circuit, a buffer circuit, and a synchronization circuit.

9. The method as claimed in claim 5, wherein the reception circuit receives address signals, command signals, or clock signals.

10. The method as claimed in claim 5, wherein the circuit arrangement is a DIMM and wherein the circuit components are memory components.

* * * * *